US008062445B2

(12) United States Patent
Kian

(10) Patent No.: US 8,062,445 B2
(45) Date of Patent: Nov. 22, 2011

(54) METHOD OF MAKING RFID DEVICES

(75) Inventor: Kouroche Kian, Altadena, CA (US)

(73) Assignee: Avery Dennison Corporation, Pasadena, CA (US)

( * ) Notice: Subject to any disclaimer, the term of this patent is extended or adjusted under 35 U.S.C. 154(b) by 631 days.

(21) Appl. No.: 11/834,139

(22) Filed: Aug. 6, 2007

(65) Prior Publication Data
US 2009/0038735 A1 Feb. 12, 2009

(51) Int. Cl.
B32B 37/00 (2006.01)
(52) U.S. Cl. .................................. 156/73.1; 156/308.2
(58) Field of Classification Search .................. 156/73.1, 156/290, 292, 308.2, 580.1, 580.2; 228/1.1, 228/110.1
See application file for complete search history.

(56) References Cited

U.S. PATENT DOCUMENTS

| 4,506,443 | A | 3/1985 | Itoh |
| 5,261,156 | A | 11/1993 | Mase et al. |
| 6,107,920 | A | 8/2000 | Eberhardt et al. |
| 6,206,292 | B1 | 3/2001 | Robertz et al. |
| 6,262,692 | B1 | 7/2001 | Babb |
| 6,406,990 | B1 | 6/2002 | Kawai |
| 6,523,734 | B1 | 2/2003 | Kawai et al. |
| 6,664,645 | B2 | 12/2003 | Kawai |
| 6,940,408 | B2 | 9/2005 | Ferguson et al. |
| 6,951,596 | B2 | 10/2005 | Green et al. |
| 7,102,520 | B2 | 9/2006 | Liu et al. |
| 7,126,482 | B2 | 10/2006 | Shoji et al. |
| 7,224,280 | B2 | 5/2007 | Ferguson et al. |
| 7,276,436 | B2 | 10/2007 | Kawai et al. |
| 2004/0125040 | A1 | 7/2004 | Ferguson et al. |
| 2004/0226645 | A1* | 11/2004 | Owen .......................... 156/73.1 |
| 2007/0007661 | A1 | 1/2007 | Burgess et al. |

FOREIGN PATENT DOCUMENTS
WO 2007049039 3/2007

OTHER PUBLICATIONS

International Search Report and Written Opinion from corresponding International Application No. PCT/US08/71903.
Kawai, Wakahiro, "Technology by OMRON to produce RFID tags", OMRON Corporation, 2005, pp. 1-6.

* cited by examiner

Primary Examiner — James Sells

(57) ABSTRACT

A method of making a radio frequency identification (RFID) device includes temporarily adhering an RFID interposer to an antenna, and subsequently ultrasonically welding the interposer leads to the antenna. The temporary adhering may involve use of any of variety of suitable adhering materials, such as an adhesive, wax, or even water. The adhering and the ultrasonic welding may be parts of a process that involves mostly continuous movement of an antenna web that has multiple antennas on it. The adhering material temporarily holds the interposer in place prior to the ultrasonic welding, which is important in a process that involves a moving web. The adhering may be such that there is no material between the conductive material interposer leads, and conductive material of the antenna. This allows the ultrasonic welding to proceed without any need to push intervening material aside.

19 Claims, 5 Drawing Sheets

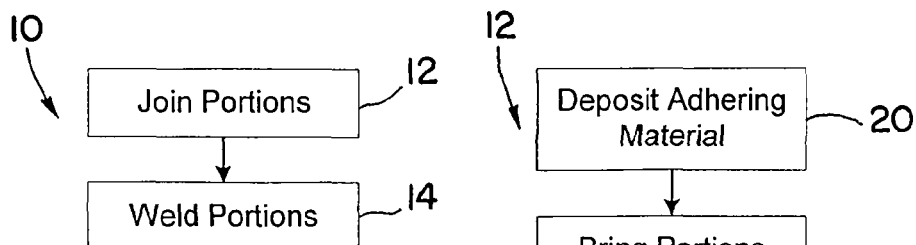
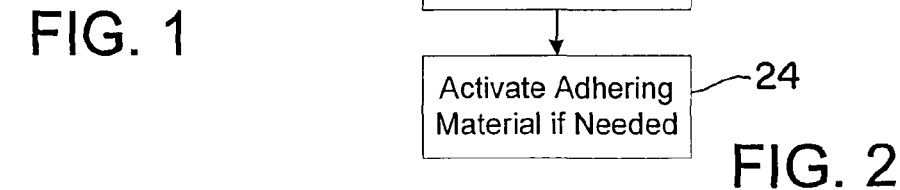
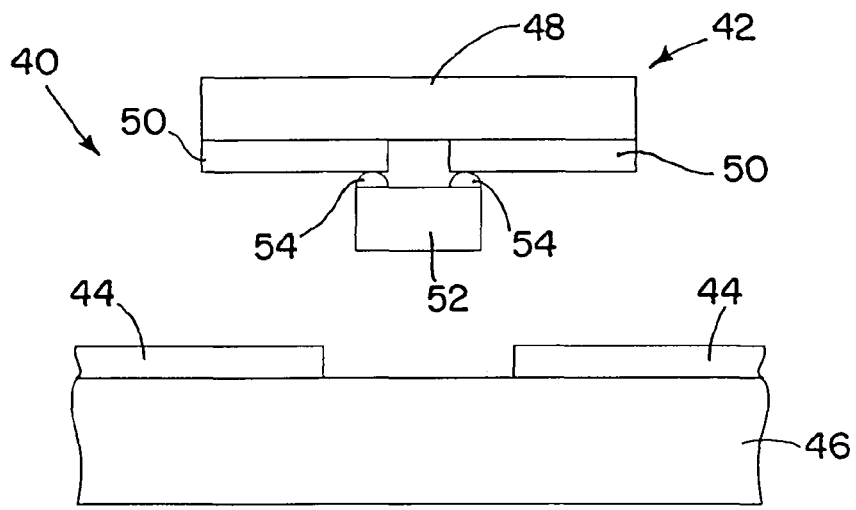
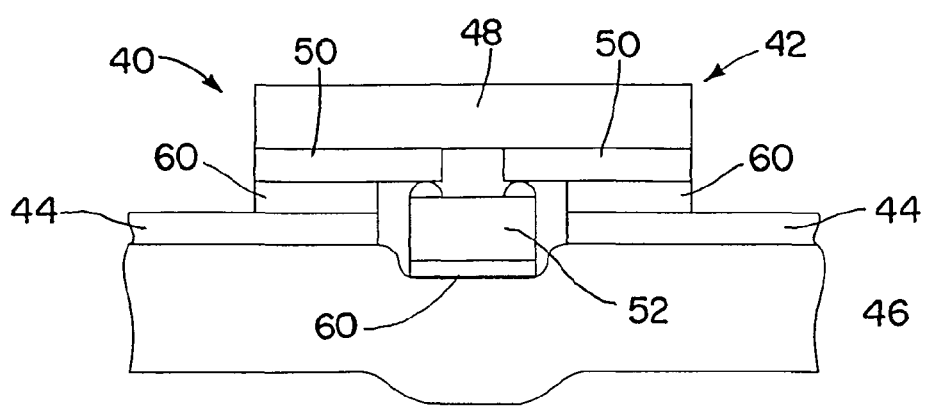

METHOD OF MAKING RFID DEVICES

BACKGROUND OF THE INVENTION

1. Field of the Invention

This invention relates to the field of radio frequency identification (RFID) devices, and methods of making RFID devices.

2. Description of the Related Art

Radio frequency identification (RFID) tags and labels (collectively referred to herein as "devices") are widely used to associate an object with an identification code. RFID devices generally have a combination of antennas and analog and/or digital electronics, which may include for example communications electronics, data memory, and control logic. For example, RFID tags are used in conjunction with security locks in cars, for access control to buildings, and for tracking inventory and parcels. Some examples of RFID tags and labels appear in U.S. Pat. Nos. 6,107,920, 6,206,292, and 6,262,692.

As noted above, RFID devices are generally categorized as labels or tags. RFID labels are RFID devices that are adhesively or otherwise have a surface attached directly to objects. RFID tags are secured to objects by other means, for example by use of a plastic fastener, string, or other fastening means.

RFID devices involve electrical connections between chips, antennas, and interposers that are used in some cases to facilitate electrical connection of the chips to the antennas. Such connections have been made using a variety of methods. Examples of such methods in flip chip bonding are: using conductive adhesives, which tend to be expensive, as well as plating processes, which can be expensive and difficult to implement; and ultrasonic welding, which has often been used in wire bonding and rarely in flip chip bonding, where it is difficult to integrate with other production processes. It will be appreciated that improvements are possible in RFID devices, in particular in view of the continued desirability to reduce costs of such devices.

SUMMARY OF THE INVENTION

According to an aspect of the invention, a method of making RFID devices includes temporarily adhering an interposer to an antenna, and subsequently ultrasonically welding the interposer to the antenna. The temporarily adhering and the welding may be parts of a process that includes a continuously moving antenna web. The adhering may include placing an adhesive or non-adhesive adhering material on the interposer and/or the antenna. It may also include dispensing a fluid with good wetability characteristics on the metallic electrodes of antennas. Example materials include a pressure sensitive adhesive (PSA), a low temperature melting wax, and even water.

According to another aspect of the invention, a method of making RFID devices includes temporarily adhering a chip to interposer leads or an antenna, and subsequently ultrasonically welding the chip to the interposer or antenna.

According to another aspect of the invention, a pair of portions of an RFID are joined together using an adhering material, and are subsequently ultrasonically welded together. The portions may be an RFID interposer and an antenna, or a chip and leads of an interposer or an antenna.

According to yet another aspect of the invention, a method of making an RFID device includes: temporarily coupling together a first portion of the RFID device to a second portion of the RFID device, using an adhering material placed on one or both of the portions; and subsequent to the coupling, ultrasonically welding together the portions together.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

In the annexed drawings, which are not necessarily to scale:

FIG. 1 is a high-level flowchart of steps in a method of making an RFID device, according to an embodiment of the present invention;

FIG. 2 is a flowchart of sub-steps of one of the steps of the method of FIG. 1;

FIG. 3 is a side view of portions of an RFID device to be combined using the method of FIG. 1;

FIG. 4 is a side view showing the RFID device of FIG. 3 after being temporarily joined;

DETAILED DESCRIPTION

Figure 5:
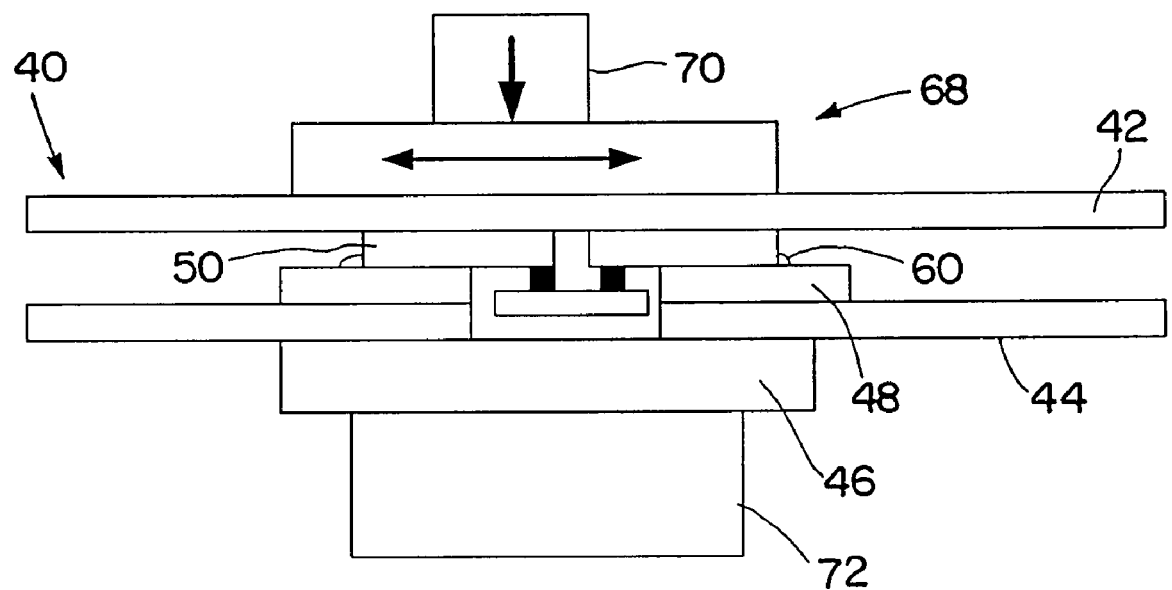
FIG. 5 is a side view illustrating the welding of the RFID device of FIGS. 3 and 4.

A method of making a radio frequency identification (RFID) device includes temporarily adhering an RFID interposer to an antenna, and subsequently ultrasonically welding the interposer leads to the antenna. The temporary adhering may involve use of any of variety of suitable adhering materials, such as an adhesive, wax, or even water. Examples of suitable adhesive adhering materials are ultraviolet-curable adhesives and pressure sensitive adhesives. The adhering and the ultrasonic welding may be parts of a process that involves mostly continuous movement of an antenna web that has multiple antennas on it. The adhering material temporarily holds the interposer in place prior to the ultrasonic welding, which is important in a process that involves a moving web. The adhering may be such that there is no material between the conductive material interposer leads, and conductive material of the antenna. This allows the ultrasonic welding to proceed without any need to push intervening material aside. Alternatively, pressure in the ultrasonic welding process may be used to push aside the adhering material.

The process of using an adhering material to temporarily join pieces prior to ultrasonic welding may also be used in forming an RFID inlay, in coupling a chip to conductive leads of an interposer or an antenna. In this case the adhering material is dispensed between the leads of the interposer or antenna. The chip is then placed precisely and held temporarily by the adhering material. More broadly, an adhering material may be used in temporarily adhering together a pair of parts or portions of an RFID device, prior to permanently joining conductive materials of the parts or portions using ultrasonic welding.

Referring initially to FIG. 1, a method 10 of making an RFID device (including a portion of an RFID device) includes temporarily adhering or joining one part or portion of the device to another part or portion in step 12, and ultrasonically welding conductive material of the parts or portions together in step 14. The ultrasonically welding of the two parts permanently joins conductive material of the two parts or portions together. As explained in greater detail below, the joined parts or portions may be an RFID interposer and an antenna, joined together to form an RFID inlay. Alternatively the parts or portions may be a chip and other parts of an RFID interposer, joined together to make the interposer. Alternatively the parts or portions may be a chip and other parts of an RFID antenna, joined together to make the inlay. The steps may be parts of a process involving a moving web of material, for example an antenna web.

The temporary adhering of step 12 may involve multiple sub-steps, such as those illustrated in FIG. 2. In sub-step 20 an adhering material may be deposited on one or both of the parts or portions to be temporarily joined. The adhering material may be a suitable adhesive material, example being a pressure sensitive adhesive. Alternatively the adhering material may be a suitable non-adhesive material, examples of non-adhesive materials being a low-temperature-melting wax and water.

In sub-step 22 the parts or portions are brought together. In sub-step 24 the adhering material may be cured or otherwise activated, if necessary. A pressure sensitive adhesive may be activated by pressing together parts to be adhered.

FIG. 3 shows one possibility of the parts to be jointed by the method 10, an RFID device 40 that includes an RFID interposer 42, and an antenna 44 on an antenna substrate 46. The RFID interposer 42 includes an RFID interposer substrate 48, conductive interposer leads 50 on the substrate 48, and an RFID chip 52 that includes chip contacts or pads 54 that are electrically coupled to the interposer leads 50, generally by direct contact.

The antenna substrate 46 and the interposer substrate 48 may include any of a variety of suitable materials, such as paper or a wide variety of suitable polymer materials. Examples of suitable materials for the interposer substrates 46 and 48 include, but are not limited to, high glass-transition-temperature polycarbonate, polyethylene terephthalate (PET), polyarylate, polysulfone, a norbornene copolymer, poly phenylsulfone, polyetherimide, polyethylenenaphthalate (PEN), polyethersulfone (PES), polycarbonate (PC), a phenolic resin, polyester, polyimide, polyetherester, polyetheramide, cellulose acetate, aliphatic polyurethanes, polyacrylonitrile, polytrifluoroethylenes, polyvinylidene fluorides, HDPEs, poly(methyl methacrylates), a cyclic or acyclic polyolefin, or paper. Other suitable materials are disclosed in U.S. Pat. No. 6,951,596, the figures and description of which are incorporated herein by reference.

The antenna 44 may have any of a variety of suitable layouts for enabling wireless communication between the RFID device 40 and other suitable devices, such as device detectors or readers. The antenna 44 may be a spiral antenna, a dipole antenna, a loop antenna, a slot antenna, antennas having characteristics of multiple of the above types of antennas, or other suitable types of antennas.

The antenna 44 may have a thickness of less than 10 microns. For example, the antenna 44 may be an aluminum antenna having a thickness of about 9 microns, or more broadly having a thickness of 9 microns or less. As another example, the antenna 44 may be a copper antenna having a thickness of 9 microns, or a thickness of less than 10 microns. It will be appreciated that thinner antennas reduce material required, and may reduce cost. However, it will be appreciated that other antenna thicknesses may be employed.

The antenna 44 and the interposer leads 50 may be made of the same material, with both being made of aluminum or copper, for example. Alternatively, different materials may be used for the antenna 44 and the interposer leads 50, with one being copper, and the other being aluminum, for example.

The interposer 42 shown in FIG. 3 is only one possible configuration for an RFID interposer. The illustrated interposer 42 is coupled to the antenna 44 is a "face-down" configuration, with the chip 52 directed toward the antenna 44. It will be appreciated that the antenna substrate 46 may have a hole or recess to help accommodate the interposer 42. It will be appreciated that other types of interposers may be coupled to an antenna in a "face-up" configuration, with their chips facing away from the antenna 44 and the antenna substrate 46. The interposer 42 may alternatively be configured with conductive material extending to the bottom side of the interposer substrate 48. As another alternative, the interposer 42 may be configured to omit a substrate entirely, simply having interposer leads coupled to contacts of a chip. It will be appreciated that such an interposer may be readily coupled to an antenna in a "face-up" or "face-down" orientations.

The temporary joining of the interposer 42 and the antenna 44 is illustrated in FIG. 4. An adhering material 60 is placed to temporarily couple together the interposer 42 and the antenna 44. As noted earlier, the adhering material 60 may be an adhesive or a non-adhesive material. The adhering material 60 may be a layer of material covering all or a large part of the interposer 42 and/or the portion of the antenna 44 and the antenna substrate 46 that the interposer 42 overlies. Thus the adhering material may be between the interposer leads 50 and the portions of the antenna 44 that are to be coupled to the interposer leads 50. Alternatively, the adhering material 60 may be a non-uniform patterned material. For example the adhering material 60 may be discrete dots of material used to temporarily join together the interposer 42 and the antenna 44. In one embodiment, given the hydrophilic surfaces of aluminum and copper, one can use the capillary forces instead of adhesion for maintaining the interposer on antenna. The use of low-melting-temperature wax or even water may have advantages over adhesive joining.

FIG. 5 illustrates the welding process for ultrasonically welding the interposer leads 50 and the antenna 44. The portions of the interposer 42 and the antenna 44 to be joined are placed between two parts of an ultrasonic welder 68, a head or horn 70 and an anvil 72. The head 70 and the anvil 72 are pressed together. This results in contact between the portions of the interposer leads 50 and the antenna 44 to be welded together. The pressing also pushes out the adhering material 60 that is between the portions of the interposer leads 50 and the antenna 44 to be welded together, leaving a very thin layer of it before the ultrasonic vibrations start.

The head 70 and/or the anvil 72 may be patterned with surface features to aid in causing engagement of the interposer leads 50 and the antenna 44. Such patterning may take the form of alternating ridges and depressions on the anvil 72. The patterning of the anvil 72 facilitates better contact between the interposer leads 50 and the antenna 44. There may be a coarse pattern on the anvil 72 and a finer pattern on the weld horn or head 70, such that in use the coarse pattern will pierce the metal layers and initiate a bond between the two plastic substrates. The ultrasonic resonance may be difficult to control through layers of plastic and adhesive. It therefore may be important to optimize the metallic layers and the carrier substrates in conjunction with the most appropriate metal welder frequencies to get suitable working windows for the process.

The welding may be performed by sending ultrasonic energy of a suitable wavelength of a suitable frequency, such as between 20 and 40 kHz. Other example parameters for the welding process are a power of about 150 watts, an energy of about 80 joules, and a pressure of about 20-30 psi (0.14 to 0.21 MPa) for aluminum-to-aluminum welding, and a power of 300-350 watts, an energy of 80 to 100 joules and a pressure of 30-40 psi (0.21 to 0.28 MPa) for copper-to-aluminum welding. The time needed to weld aluminum to aluminum may also be about 0.1 to 0.2 seconds shorter than the welding time for copper to aluminum. It will be appreciated that all of the above figures are merely examples of suitable values. The direction of the vibration for the welding process is in shear parallel to the plane of the surface to be welded. Examples of suitable welding machines for performing the ultrasonic welding are the SonoWeld MH2016/FC2016 from Sonobond Ultrasonics of West Chester, Pa., USA, and the Condor Universal Weld from STAPLA Ultrasonics of Wilmington, Mass., USA.

Figure 6:
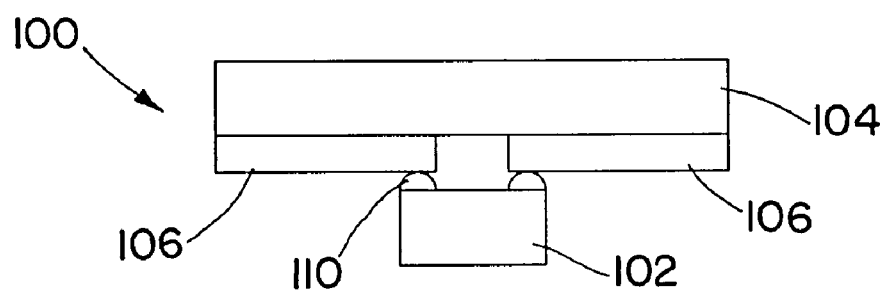
FIG. 6 is a side view of another type of RFID device that can be made using the method of FIG. 1, involving coupling of an RFID chip.

The adhering and welding process described above may also be used to form an RFID interposer or inlay, such as the RFID interposer 100 shown in FIG. 6. A chip 102 of the interposer or the antenna 100 is first temporarily joined to an interposer or an antenna substrate 104 with the chip pads precisely placed on antenna leads or on interposer leads 106. The temporary connection may be by use of an adhering material, such as that described above. Subsequently contacts (pads) 110 of the chip are ultrasonically welded to the interposer leads 106.

Figure 7:
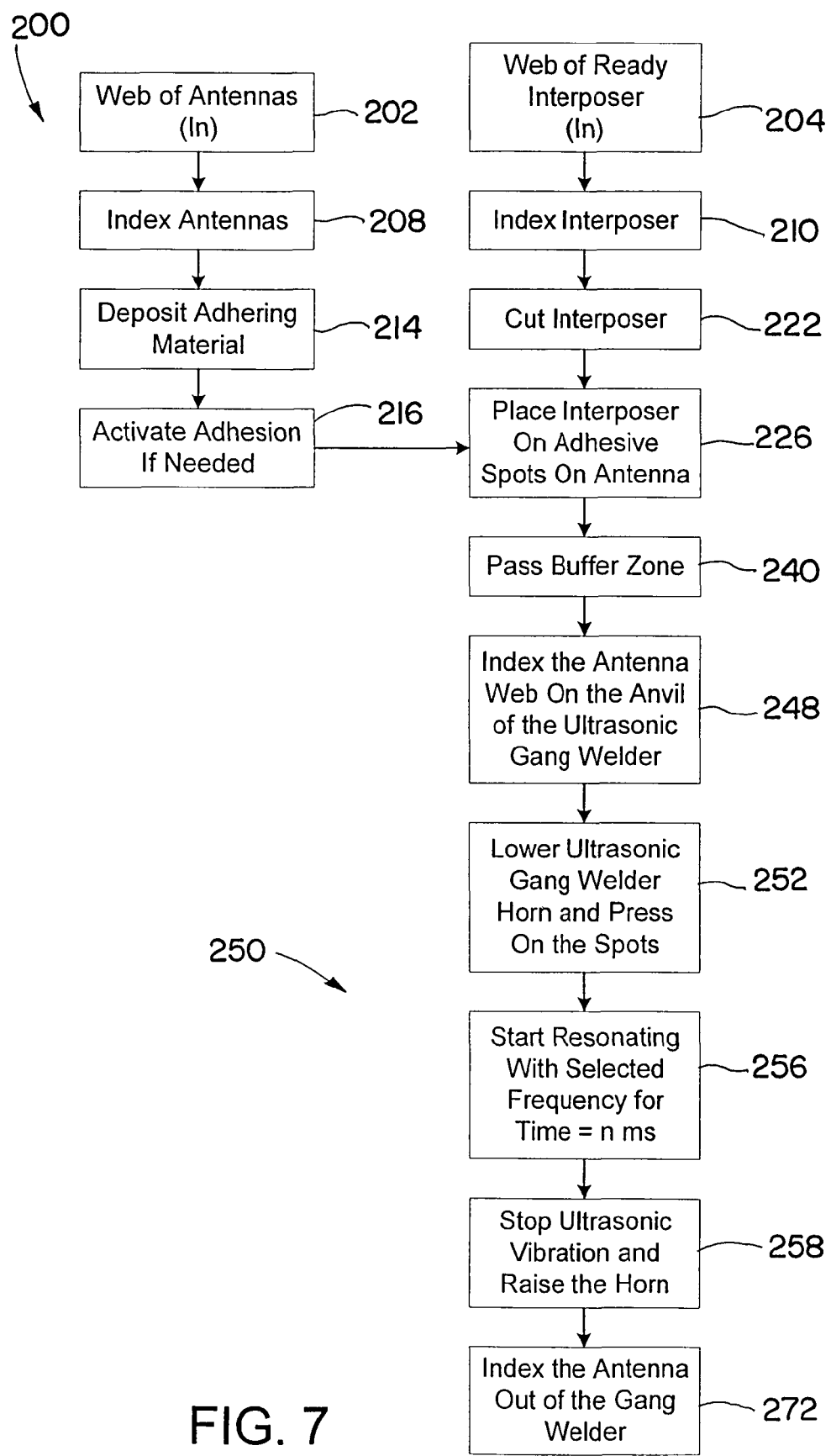
FIG. 7 is a chart showing material flow in an embodiment of the present invention.
Figure 8:
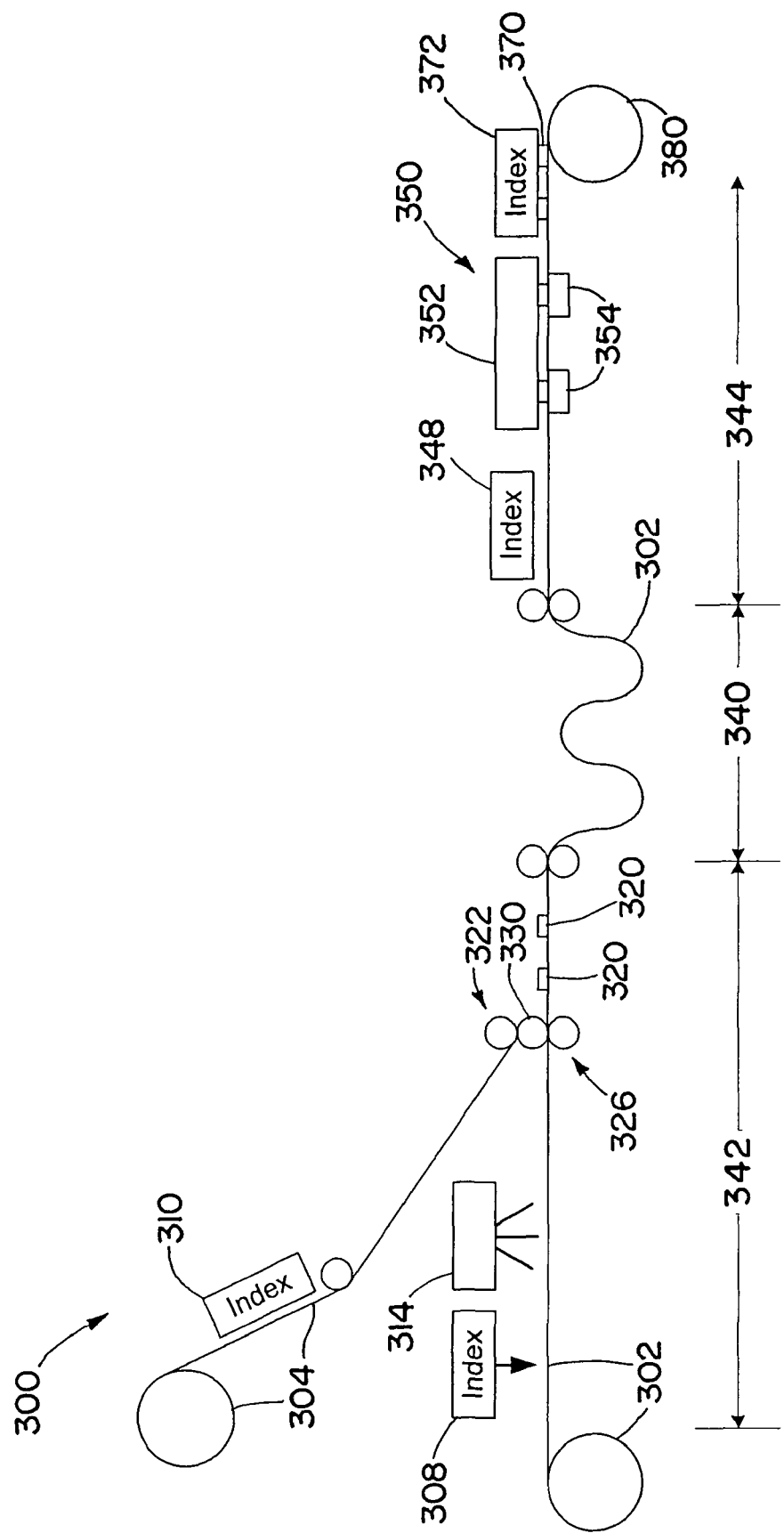
FIG. 8 is a schematic view of a system used for caring out an embodiment of the method of the present invention.
Figure 10:
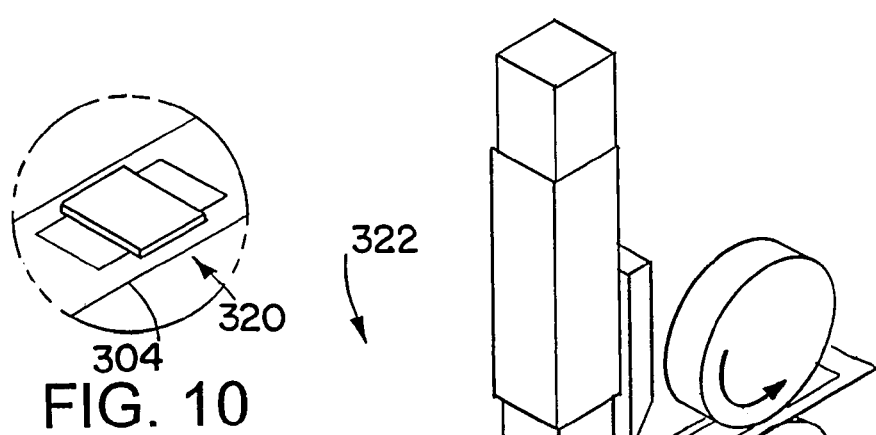
FIGS. 9, 10, and 11 show details of parts of the system of FIG. 8.
Figure 9:
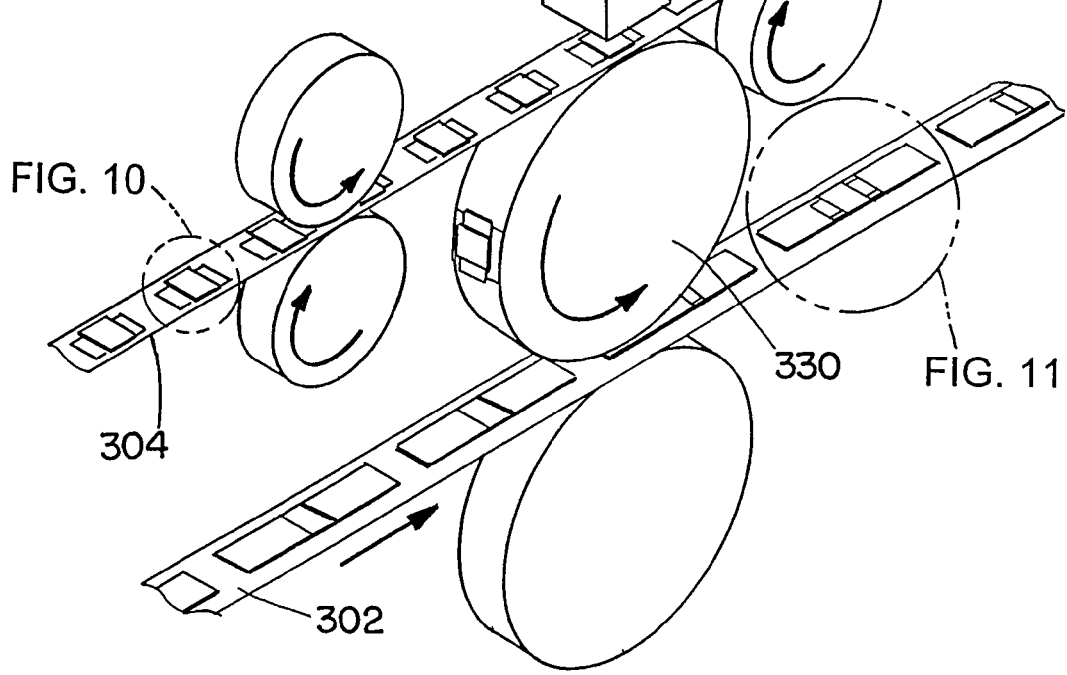
Figure 11:
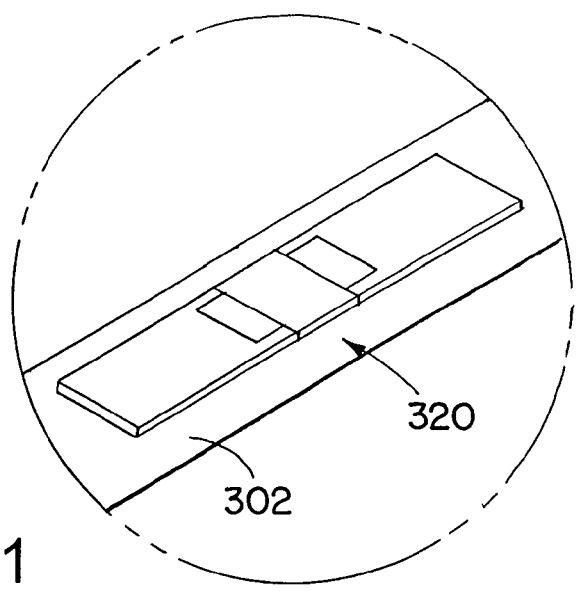

Turning now to FIGS. 7 and 8, a material flow chart 200 (FIG. 7) shows steps in the processing to form RFID devices, using an RFID device production system 300 (FIG. 8). Details regarding some aspects of the system 300 may be found in U.S. Patent Publication No. US 2006/0238345 A1, the description and figures of which incorporated herein by reference. Inputs for the system 300 include an antenna web 302 and an interposer web 304, respectively shown as elements 202 and 204 on the flow chart 200. The antenna web 302 is indexed at station 308 of the system 300, in step 208. The interposer web 304 is likewise indexed at station 310 of the system 300, in step 210. The indexing steps 208 and 210 may be performed by optically detecting indexing marks or features on the webs 302 and 304, or by other suitable methods. The indexing allows tested and functioning interposers to be repeatably separated from the interposer web 304, and for interposer placement and other operations to be performed in a repeatable fashion on the antenna web 302.

In step 214 an adhering material is deposited onto the antenna web 302 by a dispenser 314. One example of the adhering material is an adhesive, such as a pressure sensitive adhesive. The adhesive may be deposited by any of a variety of methods, including printing or spraying, in patterned or non-patterned layers. In one embodiment a pair of dots of low-melting-temperature wax are placed on each of the antennas of the antenna web, to allow respective interposers to be temporarily secured to the antennas. Following the deposit of the adhering material, the adhering material is activated, if needed, in step 216.

Individual interposers 320 are physically separated from the interposer web 304 at a separation device 322, in step 222. The separation may be by any of a variety of methods, such as cutting, punching, slicing, stamping, peeling, or a combination of these. The physically separated interposers 320 are then transported to the antenna web 302, and in step 226 are placed on the antenna web 302 by a placement device 326. The separation device 322 and the placement device 326 may be integrated with one another, so as to move the individual interposers 320 directly from physical separation from the interposer web 304 to placement on the antenna web 302. Alternatively the separation and placement operations may be separate operations. In the illustrated embodiment the separation device 322 includes a vacuum transfer drum 330 that transports the separated interposers 320 to the antenna web 302, for placement on the antenna web 302. An example of such a combined separation and placement device may be found in U.S. Pat. No. 6,951,596 or U.S. Patent Publication No. US 2006/0238345 A1. It will be appreciated that other sorts of separation and placement devices may be employed, an example of the latter being a pick-and-place device.

In step 240 a portion of the antenna web 302, with individual interposers 320 coupled to the antenna web 302, passes through a buffer zone 340 between a continuously moving zone 342 and an intermittently moving zone 344. All of the operations described up to now are performed on a continuously-moving antenna web 302, in the continuously moving zone 342. While continuous movement is appropriate for printing and placement operations, ultrasonic welding requires a period of time to be accomplished, for example 0.5 seconds. Either the welding devices must move with the moving web, which is impractical, or the antenna web 302 must be intermittently stopped in order to perform the welding. The buffer zone 340 is a zone in which some slack is maintained in the antenna web 302. The antenna web 302 continuously feeds into the buffer zone 340 from the continuous zone 342. The antenna web 302 intermittently passes from the buffer zone 340 to the intermittent zone 344.

The antenna web 302 is indexed within the intermittent zone 344 in step 248, at an indexing station 348. The indexing 248 may rely on use of the same indexing marks or other features that are used in the indexing 208 described above. Indexing the antenna web 302 aids in placing the antenna web 302 in proposer spatial relationship to the ultrasonic gang welder 350. The welding 250 performed by the gang welder 350 is performed in multiple sub-steps. In sub-step 252 the horn 352 of the gang welder 350 is lowered to press multiple interposers 320 onto their respective antennas of the antenna web 302, against anvils 354 of the gang welder. Then in sub-step 256 the horn 352 resonates to perform the actual ultrasonic welding of the interposers 320 onto the antennas. Finally the resonating is stopped and the horn is raised in sub-step 258.

The gang welder 350 is used to ultrasonically weld multiple RFID devices at one time. Since welding takes the longest time of any of the steps of the process, it is more efficient to weld multiple interposers 320 to multiple antennas at the same time. A regular ultrasonic welder has a dwell time of at least 0.5 seconds that with other process times will need 0.75 seconds or more to weld an interposer to an antenna using a double head horn, or a chip to antenna/interposer using a vacuum head. To match the linear speed of the upstream process a gang welder that combines 10 or more individual welders to simultaneously weld interposers onto antennas. It will be appreciated that a single weld head may be used to weld multiple interposers simultaneously. For example, a gang welder may have ten individual welders, each capable of welding in four locations simultaneously.

After the welding, the combined RFID devices 370 may be indexed in another indexing operation 272, at an indexing station 372. This may be a prelude to performing further operations, such as the adding of additional layers or structures to the devices 370. Examples of other layers include adhesive layers for adhering the devices 370 to objects, release layers for covering such adhesive layers prior to use, printable layers for adding bar codes, text, or graphics, and coatings for protecting the RFID devices 370. The devices 370 may also be physically separated from the antenna web 302. Alternatively the web 302 containing the devices 370 may be wound on a take-up reel 380, for later processing.

For chip placement, a similar sequence may be used. Instead of the high speed interposer attach machine in the previous embodiment, a high speed chip placement system may be used to place RFID chips from wafer directly onto RFID antenna electrodes. An example of chip placement machine is the TAL 5000 from Mühlbauer AG of Roding, Germany. Antennas may be made by patterned aluminum or copper on substrates as described above. An adhering material, such as a suitable paste, is used to keep the chip on the exact antenna area where the chip is placed. A web (like the web 302) passes by a buffer zone and enters the gang ultrasonic welder, which may be similar to the welder 352, where the nickel gold plated pads of the chips are welded to the aluminum or copper materials of the antenna electrodes. In an extra step the adhesive may be cured to add mechanical strength to the chip to antenna bonding.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A method of making an RFID device, the method comprising:
   temporarily coupling together a first portion of the RFID device to a second portion of the RFID device while the RFID device is continuously moving, using an adhering material placed on one or both of the portions;
   feeding the first and second portions to a buffer zone; and
   subsequent to the coupling, ultrasonically welding the portions together while the RFID device is intermittently moving from the buffer zone.

2. The method of claim 1,
   wherein the first portion includes an RFID interposer;
   wherein the second portion includes an antenna; and
   wherein the ultrasonic welding includes welding conductive interposer leads of the interposer to the antenna.

3. The method of claim 2, wherein the antenna has a thickness of less than 10 microns.

4. The method of claim 2, wherein the antenna and the interposer leads are made of the same material.

5. The method of claim 2, wherein the antenna and the interposer leads are made of different materials.

6. The method of claim 5,
   wherein one of the antenna and the interposer leads is made of copper; and
   wherein the other of the antenna and the interposer leads is made of aluminum.

7. The method of claim 2, wherein the antenna is part of an antenna web.

8. The method of claim 7,
   wherein the interposer is initially part of an interposer web; and
   further comprising:
      separating the interposer from the interposer web; and
      moving the interposer to the antenna web for the temporarily coupling.

9. The method of claim 1,
   wherein the first portion includes an RFID chip;
   wherein the second portion includes conductive leads of an RFID interposer or antenna; and
   wherein the ultrasonic welding includes welding the chip to the interposer or antenna leads.

10. The method of claim 9,
    wherein the adhering material includes an adhesive; and
    wherein the coupling includes adhesively attaching the portions.

11. The method of claim 10, further comprising curing the adhesive after welding the chip to the interposer or the antenna.

12. The method of claim 1, wherein the adhering material includes water.

13. The method of claim 1, wherein the adhering material includes a low-melting-temperature wax.

14. The method of claim 1, further comprising passing the web through a buffer zone between a continuously moving zone, where the coupling is performed, and an intermittently moving zone, where the welding is performed.

15. The method of claim 1, wherein the welding includes welding the portions with a gang welder, as part of a gang welding that welds multiple RFID devices substantially simultaneously.

16. The method of claim 1, wherein the welding includes pressing the portions together.

17. The method of claim 16, wherein the coupling includes placing the adhering material between conductive parts of the portions; and
    wherein the pressing includes squeezing the adhering material out from between the conductive parts of the portions.

18. The method of claim 1, wherein the adhering includes a non-adhesive material.

19. A method of making an RFID device, the method comprising:
    advancing a first web containing a plurality of interposers;
    separating each of the plurality of interposers from the web;
    providing an antenna web having a plurality of antennas;
    transporting each of the plurality of interposers to the antenna web;
    temporarily coupling together each of the plurality of separated interposers to the antenna web while the antenna web is continuously moving, using an adhering material; and
    subsequent to the coupling, ultrasonically gang welding together the plurality of interposers to the antenna web while the antenna web is intermittently moving.

* * * * *